United States Patent [19]

Hoeksma

[11] Patent Number: 5,019,955
[45] Date of Patent: May 28, 1991

[54] DC-TO-AC VOLTAGE CONVERTER HAVING GALVANICALLY SEPARATE INPUT AND OUTPUT CIRCUITS

[75] Inventor: Gerben S. Hoeksma, Winterswijk, Netherlands

[73] Assignee: N.V. Nederlandsche Appartenfabriek Nedap, De Groenlo, Netherlands

[21] Appl. No.: 494,104

[22] Filed: Mar. 14, 1990

[30] Foreign Application Priority Data

Mar. 14, 1989 [NL] Netherlands .................. 8900609

[51] Int. Cl.$^5$ .......................................... H02M 7/537
[52] U.S. Cl. ........................................ 363/21; 363/97; 323/289; 307/280; 307/300
[58] Field of Search ..................................... 363/19–21, 363/56, 97, 131; 323/289, 279; 307/270, 280, 300

[56] References Cited

U.S. PATENT DOCUMENTS

| | | | |
|---|---|---|---|
| 4,063,307 | 12/1977 | Stephens | 363/21 |
| 4,104,714 | 8/1978 | Smith et al. | 363/21 |
| 4,228,493 | 10/1980 | de Sartre et al. | 363/21 |
| 4,236,187 | 11/1980 | Mochizuki et al. | 363/56 |
| 4,318,011 | 3/1982 | Zeis | 307/300 |
| 4,566,060 | 1/1986 | Hoeksma | 323/289 |
| 4,595,974 | 6/1986 | Lethellier | 323/289 |

FOREIGN PATENT DOCUMENTS

| | | |
|---|---|---|
| 0105541 | 9/1983 | European Pat. Off. . |
| 2852943 | 12/1980 | Fed. Rep. of Germany . |
| 8704024 | 7/1987 | Italy . |

OTHER PUBLICATIONS

RCA Designer's Handbook, Solid–State Power Circuits, 1971, p. 180–181.
Effects of Power Train, etc.; J. McArdle, T. Wilson, Jr. and R. Wong, 1/1/87, pp. 2–19.
Patent Abstracts of Japan, K. Kadofuju, 11/7/88; p. 96.

Primary Examiner—Peter S. Wong
Attorney, Agent, or Firm—Fleit, Jacobson, Cohn, Price, Holman & Stern

[57] ABSTRACT

A DC-to-AC voltage converter having galvanically separate onput and output circuits, and comprising a converter transformer having at least one primary winding; a resonance capacitor connected to said at least one primary winding; a switching transistor, of which the collector-emitter path is series-connected to the at least one primary winding; and drive means for the switching transistor, wherein charge storage in the base-collector area of the switching transistor provides base drive for the switching transistor, and further comprising control means for detecting an increase of the collector-emitter voltage (Uce) of the switching transistor and for providing in response to such an increase and at least in a period of time directly following the increase, an additional base drive current for the switching transistor, which additional base drive current is gradually increased at a predetermined rate in such a manner that the storage time of the switching transistor remains substantially constant over the operating range of the converter.

12 Claims, 2 Drawing Sheets

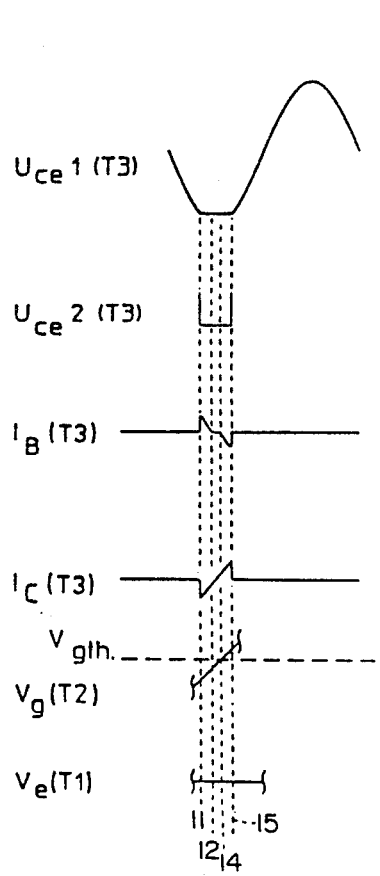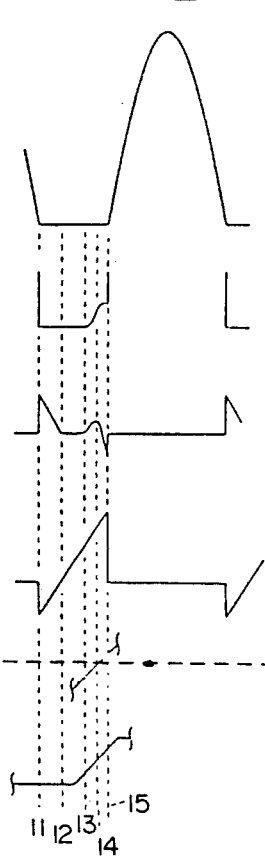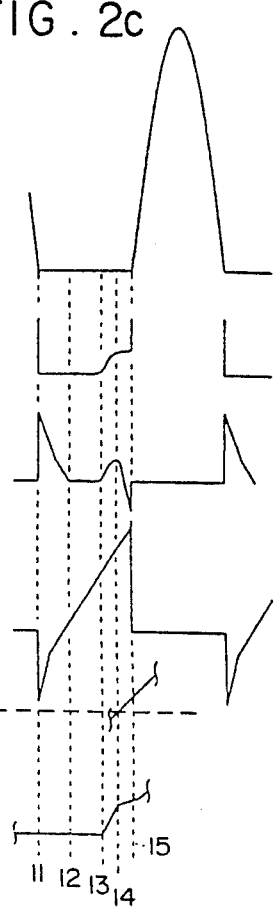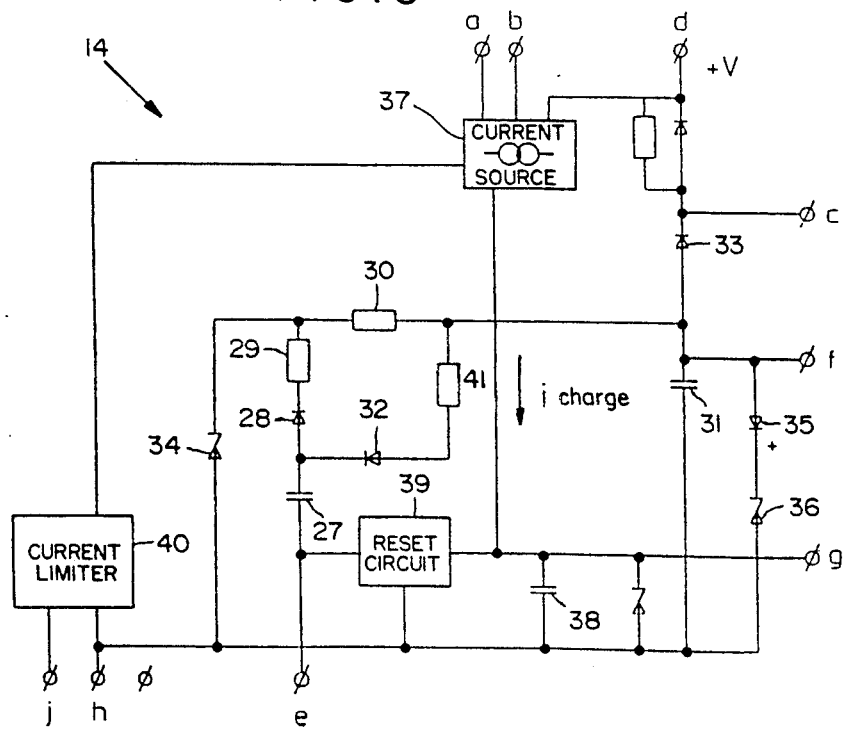

DC-TO-AC VOLTAGE CONVERTER HAVING GALVANICALLY SEPARATE INPUT AND OUTPUT CIRCUITS

BACKGROUND OF THE INVENTION

This invention relates to a DC-to-AC voltage converter having galvanically separate input and output circuits, and comprising a converter transformer having at least one primary winding; a resonance capacitor connected to said at least one primary winding; a switching transistor of which the collector-emitter path is series connected to the at least one primary winding; and drive means for the switching transistor, wherein charge storage in the base-collector area of the switching transistor provides base drive for the switching transistor.

DC-to-AC voltage converters have many uses, such as the supply of power to gas discharge lamps or, after rectifying and smoothing the AC voltage, supplying power to electronic circuits, motors, relays, magnetic valves and clutches, etc.

An example of such a DC-to-AC voltage converter is disclosed in EP-B- No. 0105541. In said known DC-to-AC voltage converter the phenomenon of charge-storage in the base-collector area of the switching transistor is used to keep the switching transistor in its conductive state. Such a base drive by charge storage will automatically adapt to the load condition of the converter and increases the converter's reliability.

In order for such a converter to be used to supply a relatively high output power it is desirable that the maximum allowable collector current of the switching transistor can indeed be used. However, in that case additional controlled base drive for the switching transistor is necessary.

A From WO-A- No. 8704024 it is known in a DC-to-AC converter to provide proportional base drive for the switching transistor by means of a current transformer. Thereby the base drive current- collector current ratio will have a fixed value.

The use of the proportional base drive method, however, does not provide a solution to the problems resulting from the variation in the transistor parameter $h_{fe}$ and the variation in dynamic properties of switching transistors.

These problems do not occur when another known method is used for controlled base drive of switching transistors, i.e., comprising the use of a so-called Baker clamp circuit, sometimes referred to as a collector catcher. This known method is described in RCA Designer Handbook "Solid State Power Circuits" 1971, pp. 180-181. In accordance with this method, the base drive is reduced as soon as the collector-emitter voltage of the switching transistor is reduced below a given value. However, the use of the Baker clamp is accompanied with other drawbacks. First, when the Baker clamp is used, in switching off the switching transistor, a reverse recovery current will develop through the Baker clamp diode, which tends to bring the switching transistor back into the conducting state. Second, when the Baker-clamp is used, the base control may become unstable, especially with transistors having a high $V_{cbo}$ value (e.g. of 1000 V or more). This is a result of the fact that it takes 1 to 5 microseconds for a reduction of the base current to result in a lower or higher collector-emitter voltage, while the charge stored in the base-collector junction has already changed. The result of the above facts is that the storage time is not constant but may vary greatly between different specimens of switching transistors. The storage time may also vary greatly depending upon the temperature of the switching transistors. Furthermore, when the base control is unstable, the storage time can vary greatly as a function of the period of conduction. This results in the collector current limitation being poorly defined. In fact, after a certain collector current has been detected, first the storage time lapses and only then the switching element passes into the non-conducting state, and meanwhile the collector current has increased further. As a consequence, the maximum power that can be given off, and also the peak voltage across the switching transistors in a converter of the type described in EP-B- No. 0105541 is subject to variation. In extreme cases, the converters may even become defect. Although the effect of the variations in characteristics of the switching transistors can in principle be reduced by suitable adjustment of the current detection level of the collector current limiting circuit arrangement, the temperature-dependence continues to exist. In addition, such an adjustment is difficult to perform in practice and constitutes a rather considerable cost item. Also, when the base control is unstable, as sometimes happens in Baker-clamp circuits, the control behaviour of the converter is sometimes seriously disrupted, as the storage time then varies periodically within a conducting period of the switching transistor. This may necessitate a lower maximum loop gain for the rest of the control loop. The control operation may even become fully unstable, because the total loop gain becomes very high with some settings. These control problems are comparable to those described in the publication entitled "Effects of Power Train Capacitance on the Dynamic Performance of DC-to-DC Converters Operating in the Discontinuous MMF Mode", in IEEE Transactions on Power Electronics, Vol. PE-2 No. 1, January 1987, pp. 2-19.

Furthermore, for bringing a switching transistor out of its conducting state, often a negative voltage of about 5V is applied through a current limiting element to the base of the switching transistor, because the saturation condition of the switching transistor is such that a high negative current must be drawn from the base. In the interior of the switching transistor, the base voltage in this period remains about 0.7 to 0.5V, but across the internal base series resistance of the switching transistor, such a high voltage drop develops that the application of an external negative voltage is needed. The generation of this voltage, however, complicates the circuit design and involves additional cost and also additional losses, which detract from the converter's efficiency.

SUMMARY OF THE INVENTION

It is an object of the present invention to provide generally an improved DC-to-AC converter, using for the base drive of the switching transistor charge storage in the base collector area of the switching transistor, while at the same time additional base drive is given, so that the transistor can be used for higher collector currents. More specifically the invention has for its object to provide a DC-to-AC voltage converter whiCh cOntrols the base drive of the switching transistor in such a manner that the "storage time" has a small and stable value and is virtually independent of the temperature and of variations in the dynamic properties of the switching transistors, and that a negative control voltage with a value of several volts for rapidly switching off the switching transistor is unnecessary. It is observed in this connection that storage time means the time which lapses between the reversal of the base drive for the switching transistor and the switching transistor's passing out of the conducting state.

For this purpose the present invention provides a DC-to-AC converter of the above-described kind which, according to the invention, is characterized by control means for detecting an increase of the collector-emitter voltage (Uce) of the switching transistor and for providing, in response to such an increase and at least in a period of time directly following the increase, an additional base drive current for the switching transistor, which additional base drive current is gradually increased at a pre-determined rate in such a manner that the storage time of the switching transistor remains substantially constant throughout the operating range of the converter.

BRIEF DESCRIPTION OF THE DRAWINGS

One embodiment of the invention will now be described, by way of example, with reference to the accompanying drawings, in which

FIGS. 2a to 2c show a number of voltage and current forms of the major elements of the device illustrated in FIG. 1 for, successively, a. minimum load of the output;
b. average load of the output;
c. maximum load of the output.

FIG. 3 shows an embodiment of a control circuit for a converter according to the present invention.

DETAILED DESCRIPTION OF THE PREFERRED EMBODIMENT

Figure 1:
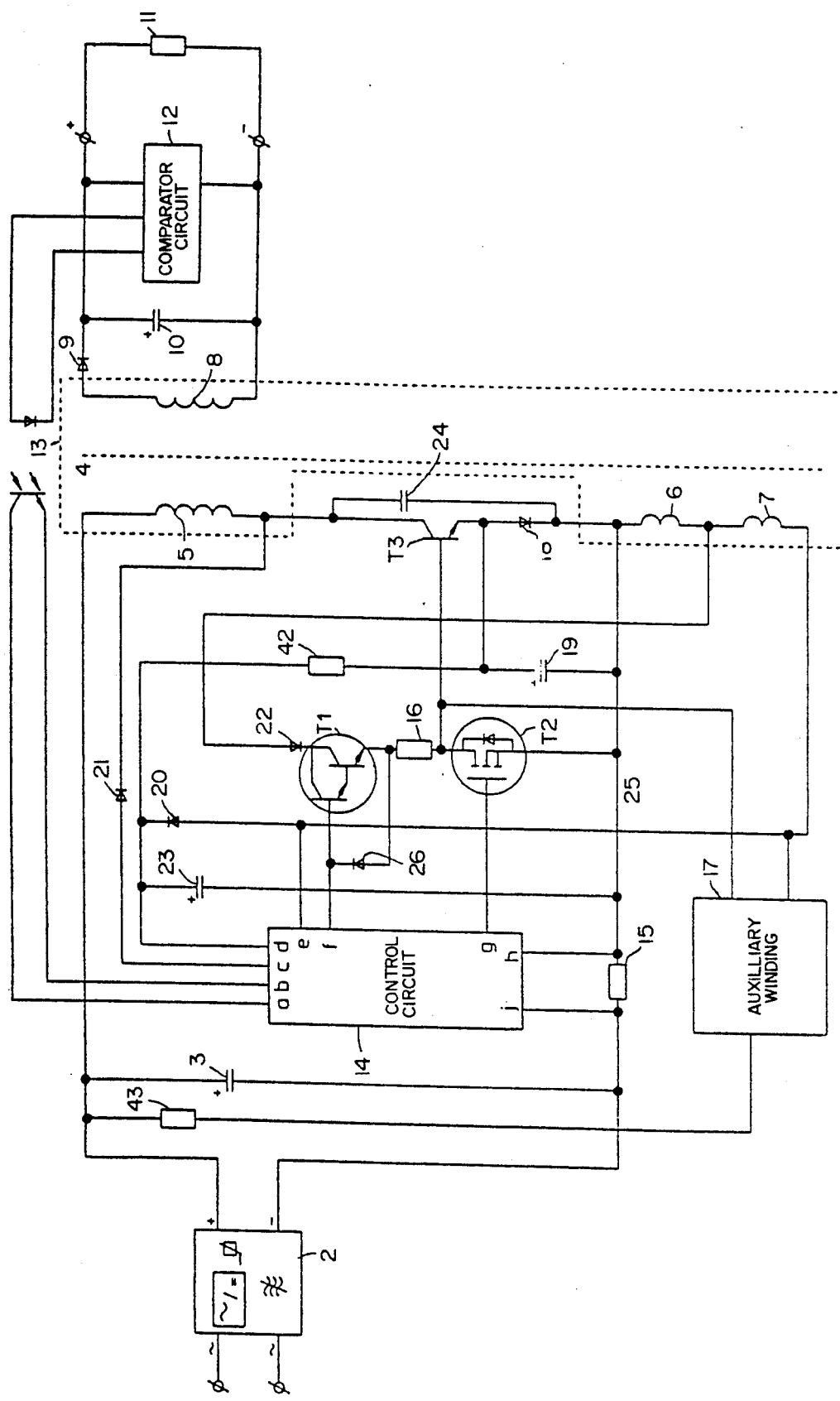
FIG. 1 is a block diagram, showing an example of a converter according to the invention.

FIG. 1 shows diagrammatically an example of a converter device of the type described, for example, in applicant's EP-B No. 0105541. An A.C. mains voltage can be connected to input terminals 1. In input stage 2, the voltage is rectified, the starting current is limited, and radio-frequency filtering takes place, while a capacitor 3 provides for smoothing the rectified voltage. Subsequently, in the converter proper, the D.C. voltage is converted into A.C. voltage. The converter comprises a switching transistor T3, which is periodically switched on and off to form an A.C. voltage across the primary winding 5 of a transformer 4.

In the embodiment shown, the collector-emitter path of switching transistor T3 is series-connected to the primary winding 5. Furthermore, a resonance capacitor is provided which may be connected in parallel with the collector-emitter path of the switching transistor and/or in parallel with the primary winding. In the example shown, a resonance capacitor 24 is connected in parallel to the collector-emitter path of the switching transistor T3. Furthermore, a diode 18 is connected to the emitter of the switching transistor in series with two series-connected auxiliary windings 6 and 7 of the converter transformer 4.

The auxiliary winding 6 is connected at one end through a current measuring resistor 15 to the negative output of the input stage 2, and at the other end through a diode 22 to the supply terminal of a transistor element T1. The auxiliary winding 6 may alternatively be directly connected to the transistor element T1. A smoothing capacitor is not provided in either of the cases. In this example, the transistor element is formed as a follower circuit built up of two transistors. The connecting electrodes of the transistor element will be referred to by the terms of collector, base and emitter, similar to a single transistor. Diode 22 is therefore connected to the collector of the transistor element T1. The base of transistor element T1 is connected to connecting pin f of a control circuit 14 shown in FIG. 3, and to be described in more detail hereinafter.

The emitter of transistor element T1 is connected through a resistor 16 to the base of the switching transistor. The emitter of transistor element T1 is further connected through resistor 16 to the drain-source circuit of a power field effect transistor, in this example a MOSFET T2. The gate of MOSFET T2 is connected to connecting pin 9 of the control circuit 14. MOSFET T2 further comprises, in parallel with the drain-source path, an integrated diode di. Resistor 16 is connected through MOSFET T2 to the line 25 connecting the auxiliary winding 6 and negative output of input stage 2, which line functions as a neutral line.

Connected further between the base of the transistor element T1 and the emitter thereof is a diode 26, the cathode of which is connected to the base.

The ends of the current measuring resistor 15 disposed in line 25 are connected to the lead terminals j and h of control circuit 14.

Connecting pin c of the control circuit 14 is connected through a diode 21 to the collector of the switching transistor T3. Connecting pin d of control circuit 14 is connected through a capacitor 23 to line 25 and through a diode 20 to the free end of auxiliary winding 7. Furthermore, connecting pin d is connected through a resistor 42 and a capacitor 19 to line 25, while the node between resistor 42 and capacitor 19 is connected to the emitter of the switching transistor T3.

Lead terminal e of the control circuit is connected through a diode 20 to lead terminal d, and is further connected to the free end of the auxiliary winding 7.

In the example shown, there is further used a starting circuit 17 which by means of a capacitive coupling with the auxiliary windings 6, 7 can start the converter in a self-oscillating manner. As a consequence, sufficient voltage can be generated across the auxiliary winding 6 to activate the transistor element T1 through diode 22, so that the transistor element T1 can drive the base of the switching transistor T3 through resistor 16. The starting circuit 17 is connected through a resistor 43 to the positive terminal of the input stage. Furthermore, the starting circuit is connected to the base of the switching transistor T3 and to the free end of the auxiliary winding 17.

In the example here described, power is taken from a secondary winding 8 which is not strongly coupled with the primary winding 5. The A.C. voltage across winding 8 is subsequently rectified and smoothed by rectifier 9 and capacitor 10, whereafter the resulting D.C. voltage is supplied to a load 11. It is also possible that a plurality of secondary windings are used, coupled to a plurality of rectifiers and smoothing capacitors, so that different output voltages are obtained, or that the output voltage of one or more secondary windings supplied direct to a load, for example, a gas discharge lamp. A comparator circuit 12 now compares the desired value of the output parameter with the actual value and, through a feedback element 13 with galvanic separation provides a feedback signal to the connecting pins a and b of control circuit 14. Element 13 may, for example, be an opto-coupler with one or more LED's and a photosensitive semiconductor element. The control circuit controls the time switching transistor T3 is in the conducting state, and hence the output power provided by the converter.

FIG. 2 shows a number of voltage and current forms occurring in the device of FIG. 1, i.e., in FIG. 2a for zero load, in FIG. 2b at average load, and in FIG. 2c for maximum load conditions.

The first line of FIG. 2 shows the variation in time of the collector-emitter voltage Uce of switching transistor T3. The second line diagrammatically shows the same voltage form as in the first line, but greatly magnified in the vertical direction in the area where the switching action of the switching transistor takes place. The third and fourth lines of FIG. 2 show the variation in time of the base current and the collector current of switching transistor T3. The fifth line of FIG. 2 shows the variation in time of the gate voltage of field effect transistor T2, and the sixth line of FIG. 2 shows the variation of the emitter voltage of transistor element T1.

It will be seen that under zero load conditions (FIG. 2a) no additional base drive of the switching transistor T3 is needed.

The operation of the control circuit is as follows. At time t1, the voltage across the resonance capacitor 24 has oscillated back to the zero level, and the base collector diode of switching transistor T3 comes into forward conduction, the current further flowing through the integrated diode di in MOSFET T2. Charge storage now takes place in the base collector area of switching transistor T3. The charge stored provides in the conduction period from t2 the base drive for switching transistor T3. At time t3, however, switching transistor T3 starts ti pass out of saturation, and the collector voltage of switching transistor T3 begins to increase. This effect is clearly shown in FIGS. 2b and 2c in the second line (Uce2 (T3)). This is passed through diode 21 to the control circuit 14, which from this moment causes the base voltage of transistor element T1, and hence also the emitter voltage thereof to increase at a pre-determined rate. (see FIGS. 2b, 2c, the last line).

Before time t3, this voltage was such that no or almost no base current could flow through resistor 16 to the base of switching transistor T3, but on the other hand had such a level that a small increase of the voltage would cause current to flow in the resistor, as shown in the third line of FIG. 2. The choice of the correct rate of increase in base drive is highly important for the good operation of the converter. This rate is determined experimentally for a given converter, with the storage time being determined as a function of the conduction period of switching transistor T3. Too fast an increase of the base drive leads to a rapid increase of the storage time after time t3, which is undesirable. On the other hand, too slow an increase of the base drive leads to a needlessly high collector-emitter voltage across switching transistor T3 in the interval t3-t5, and hence to needlessly high Ohmic losses. In the first microseconds after the switching transistor has passed out of saturation, the base drive is gradually increased independently of the rate at which the collector voltage of the switching transistor is increased. The charge stored in the base collector function then remains approximately constant, so that the storage time also remains constant and control instability is prevented.

In a much used switching transistor of type BU 508 A, it is thus possible, with a collector-emitter voltage of 3-7V in interval t3-t5, for the storage time to be brought to a stable value of approximately 2 $\mu$seconds, while the collector current can increase to well over 4A. The fall time (90%-10% of the final value of the collector current) is 0.4 $\mu$sec., in which connection it is of special importance that there is no "current-tail". According to manufacturer's data for type BU 508 A, however, the storage time is typically 7 $\mu$sec, and the fall time typically 0.7 $\mu$sec.

The result of the use of a base drive increasing at an adapted rate is that the switching transistor is in the fully blocking state already at very low collector-emitter voltages (50 to 200 V), so that the load of the switching transistor remains well within the safe operating range. A reliable and stable operation of the converter is thus ensured also at high ambient temperatures.

When switching transistors like T3 are controlled in accordance with the present invention, the variation in their static and dynamic properties leads mainly to a shift of time t3, and also to some variation in the level of the collector-emitter voltage in period t3-t5, but hardly to a change in storage time.

At time t4, control circuit 14 has brought the gate voltage of field effect transistor T2 to the threshold value Vgth required to bring T2 into the conducting state. Thereafter, the current in the FET increases with time, so that at time t5 switching transistor T3 has been driven out of the conducting state. In the blocking or cut off period t5-t1 of switching transistor T3, initially field effect transistor T2 is maintained in the conducting state. As a consequence, the base of switching transistor T3 is negatively biased, because the emitter is maintained at one diode threshold voltage above zero level.

Some time before switching transistor T3 becomes again conductive, field effect transistor T2 is, however, blocked; the negative bias on the base can then for example be taken over by a diode 26 connected to control circuit 14. Naturally the base voltage of transistor element T1 is now also kept so low that T1 is unable to supply positive base current to switching transistor T3.

The control circuit 14 will now be described in more detail with reference to the embodiment shown in FIG. 3. An A,C,. voltage taken from an auxiliary winding 6,7 of the converter transformer 4 is clipped by a Zener diode 34 via connecting pin e, a coupling capacitor 27, a diode 28, and a discharge current limiting resistor 29, and subsequently supplied through an RC network consisting of a resistor 30 and a capacitor 31 and through connecting pin f to the base of transistor element T1 in FIG. 1. During the blocking phase of switching transistor T3, coupling capacitor 27 is charged through resistor 41 and diode 32 with a current supplied through field effect transistor T2, resistor 16, diode 26 and connecting pin f. In this way, the charging current for coupling capacitor 27 is also used to keep the base of switching transistor T3 under a negative bias. The resistance of resistor 41 is higher by a factor of two to ten than that of resistor 29, which together with the relatively high top-top value of the A.C. voltage signal at connecting pin e results in the voltage after coupling capacitor 27 being subjected to a negative shift in level. The result is that the voltage at Zener diode 34 does not become positive until just before the voltage across switching transistor T3 has oscillated back to nil V. The R.C. time of R.C. circuit 30,31 has been so selected that transistor element T1 cannot pass to the conduction before the voltage across switching transistor T3 has decreased to zero. Then, from time t1, connecting pin f is kept low through diodes 21 and 33. Only when, after time t3, transistor T3 starts to pass out of saturation, does the voltage at connecting pin c increase. Capacitor 31 is now charged through resistor 30. As a consequence the voltage at connecting pin f increases and, through resistor 16, the base drive of switching transistor T3 increases as well. The rate of increase of the base drive is determined by the values of resistor 30 and capacitor 31, the level of the Zener voltage of diode 34, and the value of base resistor 16. The increase in base drive continues until diode 33 becomes conducting, or diode 35 and Zener diode 36 become conducting, or until switching transistor T3 is switched off and the driving voltage for transistor element T1 through coupling capacitor 27 drops out. The control of the output power of the converter is effected by means of the feedback signal which is provided by feedback element 13. This signal is supplied to the control circuit through connecting pins a and b, and controls a current source 37. This current source charges a capacitor 38, which is connected direct to the gate of FET T2. A reset circuit 39 has discharged capacitor 38 before time t1, and thereafter the charging of capacitor 38 begins. A larger feedback signal now effects a more rapid charging of capacitor 38, so that the gate threshold voltage of field effect transistor T2 is reached earlier and hence switching transistor T3 is switched off earlier. Finally, a collector current limiter 40 checks the voltage across current measuring resistor 15, and when a pre-determined threshold level is exceeded, capacitor 38 is rapidly charged by current source 37, so that field effect transistor T2 switches off switching transistor T3.

For the current source 37, reset circuit 39 and current limiter 40, various circuits can be used, which are known per se and are not therefore described in any detail herein.

It is observed that, after reading the above, various modifications will readily occur to one skilled in the art. Such modifications are considered to fall within the scope of the present invention.

What I claim is:

1. A DC-to-AC voltage converter having galvanically separate input and output circuits, and comprising a converter transformer having at least one primary winding; a resonance capacitor connected to said at least one primary winding; a switching transistor having a collector-emitter path series-connected tot he at least one primary winding and a base-collector area; and drive means for the switching transistor, wherein charge storage in the base-collector area of the switching transistor provides base drive for the switching transistor; control means for detecting an increase of voltage in the collector-emitter path of the switching transistor and for providing in response to such an increase and at least in a period to time directly following the increase an additional base drive current for the switching transistor, which additional base drive current is gradually increased at a predetermined rate in such a manner that a storage time of the switching transistor remains substantially constant over an operating range of the converter.

2. A DC-to-AC converter as claimed in claim 1, wherein the control means comprises a power field effect transistor having a main current path connected between the base of the switching transistor and a point of the converter that is connected to the emitter of the switching transistor, and the gate electrode of which is connected to a control circuit constituting part of the control means.

3. A DC-to-AC converter as claimed in claim 2, characterized in that at least one diode is series-connected between the emitter of the switching transistor and said point connected to the emitter.

4. A DC-to-AC converter as claimed in claim 2, characterized in that, in operation, the control circuit supplies a gradually increasing voltage to the gate electrode of the field effect transistor to provide a negative base drive for the switching transistor which increases at a pre-determined rate.

5. A DC-to-AC converter as claimed in claim 1, characterized by a transistor element which forms part of the control means, said transistor element having an output connected through a resistor to the base of the switching transistor, and a control input that is connected through at least one diode to the collector of the switching transistor and is controlled by a control voltage which is low so long as the collector-emitter voltage of the switching transistor is low, and which increases gradually as soon as the collector-emitter voltage of the switching transistor exceeds a pre-set value.

6. A converter as claimed in claim 5, characterized in that the transistor element is formed as a follower circuit with two transistors, the collectors of which are connected to each other, the base of one transistor forming the control input and the emitter of the other transistor forming the output.

7. A converter as claimed in claim 5, characterized in that a supply terminal of the transistor element is connected without the intermediary of a smoothing capacitor direct, or through a rectifying element, to an auxiliary winding of the converter transformer.

8. A converter as claimed in any of claim 5, characterized in that the control input of the transistor element is connected through at least one capacitor to the emitter of the switching transistor.

9. A converter as claimed in any of claim 2, characterized in that the power field effect transistor comprises an integrated diode parallel to the main current path.

10. A converter as claimed in claim 2, characterized in that the control circuit comprises controllable current source means which are connected through a feedback element with galvanic separation to the output circuit of the converter and which, under the control of signals provided by the feedback element in operation charge a capacitor which is connected direct to the gate electrode of the power field effect transistor.

11. A converter as claimed in claim 10, characterized in that the control circuit comprises a collector current limiter circuit which measures the voltage which in operation prevails across a current measuring resistor connected between the emitter of the switching transistor and negative input terminal of the converter, and that when a pre-determined threshold value of said voltage is exceeded supplies a control signal to the controllable current source means which in response to the control signal rapidly charge said capacitor.

12. A converter as claimed in claim 10, characterized in that the control circuit comprises a reset circuit which discharges said capacitor before the switching transistor assumes the conducting state.

* * * * *